United States Patent
Patra

(10) Patent No.: US 9,612,540 B2
(45) Date of Patent: Apr. 4, 2017

(54) METHOD OF OPERATING A MICROLITHOGRAPHIC APPARATUS

(71) Applicant: Carl Zeiss SMT GmbH, Oberkochen (DE)

(72) Inventor: Michael Patra, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 166 days.

(21) Appl. No.: 14/628,544

(22) Filed: Feb. 23, 2015

(65) Prior Publication Data

US 2015/0168849 A1   Jun. 18, 2015

Related U.S. Application Data

(63) Continuation of application No. PCT/EP2012/004211, filed on Oct. 8, 2012.

(51) Int. Cl.
*G03F 7/20* (2006.01)

(52) U.S. Cl.
CPC .......... *G03F 7/70558* (2013.01); *G03F 7/704* (2013.01); *G03F 7/7055* (2013.01);
(Continued)

(58) Field of Classification Search
CPC ............. G03F 7/70558; G03F 7/70075; G03F 7/70091; G03F 7/770125; G03F 7/70083;
(Continued)

(56) References Cited

U.S. PATENT DOCUMENTS

| 5,684,566 A | 11/1997 | Stanton |
| 7,061,582 B2 | 6/2006 | Zinn et al. |

(Continued)

FOREIGN PATENT DOCUMENTS

| EP | 0 744 641 A2 | 11/1996 |
| EP | 1 262 836 A1 | 12/2002 |

(Continued)

OTHER PUBLICATIONS

International Search Report for corresponding PCT Appl. No. PCT/EP2012/004211, dated Jun. 13, 2013.

(Continued)

*Primary Examiner* — Michelle M Iacoletti
(74) *Attorney, Agent, or Firm* — Fish & Richardson P.C.

(57) ABSTRACT

A method of operating a microlithographic apparatus comprises the steps of providing an illumination system comprising an array of tiltable mirrors, wherein a light irradiance distribution on the array varies by at least 50% along a first line; specifying a scan integrated target angular light distribution and a target light energy for a point moving through an illumination field along a second line that extends parallel to a scan direction and is an image of the first line; determining a group of those mirrors through which the first line extends; determining tilt angles of the mirrors of the group such that a real angular light distribution and a real light energy for the point approximate the respective target values; producing the illumination field by forming an image of the array on a mask; and imaging a portion of the mask on a surface while the mask moves along the scan direction.

22 Claims, 7 Drawing Sheets

(52) U.S. Cl.
CPC ...... *G03F 7/70075* (2013.01); *G03F 7/70083* (2013.01); *G03F 7/70091* (2013.01); *G03F 7/70116* (2013.01); *G03F 7/70125* (2013.01); *G03F 7/70133* (2013.01); *G03F 7/70358* (2013.01)

(58) Field of Classification Search
CPC ............ G03F 7/70116; G03F 7/70133; G03F 7/70358; G03F 7/704; G03F 7/7055
See application file for complete search history.

(56) References Cited

U.S. PATENT DOCUMENTS

| | | | |
|---|---|---|---|
| 2003/0002022 A1* | 1/2003 | Schultz | G02B 17/0621 355/67 |
| 2006/0087636 A1 | 4/2006 | Kuit et al. | |
| 2010/0157269 A1 | 6/2010 | Deguenther et al. | |
| 2010/0277708 A1 | 11/2010 | Fiolka et al. | |
| 2011/0014799 A1 | 1/2011 | Dinger et al. | |
| 2012/0051622 A1 | 3/2012 | Gyoda et al. | |
| 2014/0043665 A1* | 2/2014 | Deguenther | G03F 7/70058 359/225.1 |

FOREIGN PATENT DOCUMENTS

| | | |
|---|---|---|
| EP | 2 202 580 A1 | 6/2010 |
| EP | 2 209 135 A1 | 7/2010 |
| JP | H09-6011 A | 1/1997 |
| JP | 2010-153875 | 7/2010 |
| JP | 2012-054425 | 3/2012 |
| WO | WO 2005/026843 A2 | 3/2005 |
| WO | WO 2009/026947 | 3/2009 |
| WO | WO 2009/121438 A1 | 10/2009 |

OTHER PUBLICATIONS

Japanese Office Action, with translation thereof, for corresponding JP Appl No. 2015-535993, dated Aug. 15, 2016.

* cited by examiner

METHOD OF OPERATING A MICROLITHOGRAPHIC APPARATUS

CROSS-REFERENCE TO RELATED APPLICATIONS

The present application is a continuation of, and claims benefit under 35 USC 120 to, international application PCT/EP2012/004211, filed Oct. 8, 2012, the entire disclosure of which is incorporated by reference herein.

BACKGROUND OF THE INVENTION

1. Field of the Invention

The invention generally relates to a method of operating a microlithographic apparatus, for example a projection exposure apparatus or a mask inspection apparatus. The invention particularly relates to EUV apparatus in which a real image of an array of reflective optical elements is produced on a mask to be imaged. Subject of the invention is also an apparatus which is suitable to perform such a method.

2. Description of Related Art

Microlithography (also referred to as photolithography or simply lithography) is a technology for the fabrication of integrated circuits, liquid crystal displays and other microstructured devices. The process of microlithography, in conjunction with the process of etching, is used to pattern features in thin film stacks that have been formed on a substrate, for example a silicon wafer. At each layer of the fabrication, the wafer is first coated with a photoresist which is a material that is sensitive to light of a certain wavelength. Next, the wafer with the photoresist on top is exposed to projection light through a mask in a projection exposure apparatus. The mask contains a circuit pattern to be imaged onto the photoresist. After exposure the photoresist is developed to produce an image that corresponds to the circuit pattern contained in the mask. Then an etch process transfers the circuit pattern into the thin film stacks on the wafer. Finally, the photoresist is removed. Repetition of this process with different masks results in a multi-layered microstructured component.

A projection exposure apparatus typically includes an illumination system that illuminates a field on the mask that may have the shape of a rectangular or curved slit, for example. The apparatus further comprises a mask stage for aligning the mask, a projection objective (sometimes also referred to as 'the lens') that images the portion with the illumination field on the mask onto the photoresist, and a wafer alignment stage for aligning the wafer coated with the photoresist.

One of the essential aims in the development of projection exposure apparatus is to be able to lithographically define structures with smaller and smaller dimensions on the wafer. Small structures lead to a high integration density, which generally has a favorable effect on the performance of the microstructured components produced with the aid of such apparatus. Furthermore, with high integration densities more components can be produced on a single wafer, which increases the throughput of the apparatus.

Various approaches have been pursued in the past to achieve this aim. One approach is to improve the illumination of the mask. Ideally, the illumination system of a projection exposure apparatus illuminates each point of the field illuminated on the mask with projection light having a well defined angular light distribution and energy. The term angular light distribution describes how the light energy of a light bundle, which converges towards a particular point on the mask, is distributed among the various directions of the rays that constitute the light bundle.

The angular light distribution of the projection light impinging on the mask is usually adapted to the kind of pattern to be imaged onto the photoresist. For example, relatively large sized features may require a different angular light distribution than small sized features. The most commonly used angular light distributions are referred to as conventional, annular, dipole and quadrupole illumination settings. These terms refer to the irradiance distribution in a pupil plane of the illumination system. With an annular illumination setting, for example, only an annular region is illuminated in the pupil plane. Thus there is only a small range of angles present in the angular light distribution of the projection light, and all light rays impinge obliquely with similar angles onto the mask.

In the past the desired angular light distribution has often been produced by a diffractive optical element, a zoom objective and a pair of axicon elements. The diffractive optical element determines the basic angular light distribution, which can then be modified with the help of the zoom objective and the axicon elements. A drawback of this approach is that the flexibility to modify the angular light distribution is restricted. For example, changing from an annular illumination setting to a dipole illumination setting involves an exchange of the diffractive optical element.

It has therefore been proposed to use a mirror array to produce the desired angular light distribution. Such illumination systems are described in EP 1 262 836 A1, US 2006/0087636 A1, U.S. Pat. No. 7,061,582 B2 and WO 2005/026843 A2, for example. In these illumination systems the mirror array illuminates an optical raster element that illuminates on the mask an illumination field having the desired geometry and irradiance distribution.

In the illumination system disclosed in US 2010/0157269 A1 the optical raster element is dispensed with. The mirror array is thus directly imaged on the mask. For that reason the mirror array has the same overall geometry as the field that is illuminated on the mask. At a given time, a point on the mask can be illuminated only from a single direction, which is determined by the tilt angle of the mirror that illuminates that point at that time. Nevertheless almost any arbitrary angular light distribution may be attained, because the point can be illuminated successively from different directions while it moves during a scan operating through the illumination field. The desired angular light distribution is therefore not produced simultaneously as in the other prior art illumination systems, but only after scan integration. An optical raster element, which is arranged between the light source and the mirror array, ensures that all mirrors of the array are illuminated by the light source in exactly the same way. This simplifies the control of the mirror array. Uniform illumination conditions on the mirrors also ensure that lateral shifts of a light beam illuminating the mirror array has no impact on the angular light distribution and light energy at mask level.

Another approach to improve the resolution of the apparatus is to reduce the wavelength of the projection light. Until recently the most sophisticated projection exposure apparatus used projection light having a wavelength of 193 nm, which is in the vacuum ultraviolet (VUV) spectral range. Meanwhile also projection exposure apparatus are available which use projection light having a wavelength of only 13.5 nm. This wavelength is in the extreme ultraviolet (EUV) spectral range, and therefore such apparatus are often simply referred to as EUV apparatus. Since there are no optical materials available which are sufficiently transparent for EUV projection light, such apparatus are of the catoptric type, i.e. they contain only mirrors.

The approach to let the mirror array illuminate the mask directly, i.e. without an intermediate optical raster element that destroys the imaging relationship, has significant advantages also for EUV apparatus, because it reduces the number of reflective surfaces that are required in the illumination system and thus helps to improve the throughput of the apparatus.

SUMMARY OF THE INVENTION

An object of the present invention is to provide a method of operating a lithographic apparatus, in which an array of reflective optical elements is imaged on a mask. The method shall ensure that the angular light distribution and/or the light energy can be finely adjusted and be better adapted to the pattern contained in the mask.

In accordance with the present invention, this object is achieved by a method comprising the following steps:
a) providing an illumination system comprising an array of reflective optical elements, wherein each reflective optical element is configured to be tilted around at least one tilt axis by a tilt angle, and wherein the illumination system is configured to produce a light irradiance distribution on the array, wherein the light irradiance distribution varies by at least 50%, and preferably by at least 75%, along a first line;
b) specifying a scan integrated target angular light distribution and a scan integrated target light energy for a point that moves through an illumination field along a second line that extends parallel to a scan direction of the apparatus and which is an image of the first line;
c) determining a group of those reflective optical elements through which the first line extends;
d) determining tilt angles of the reflective optical elements of the group such that a scan integrated real angular light distribution and a scan integrated real light energy for the point approximate the target angular light distribution and the target light energy, respectively, that have been specified in step b);
e) setting the tilt angles determined in step d);
f) producing the light irradiance distribution on the array;
g) producing the illumination field by forming a real image of the array on a mask;
h) imaging a portion of the mask, which is illuminated by the illumination field, on a surface while the mask moves along the scan direction.

The invention is based on the perception that a uniform illumination of the reflective optical element of the array may result in a reduced system complexity, but has significant drawbacks with regard to the setting of the angular light distribution and also of the light energy at mask level. More specifically, if each reflective optical element, which contributes to the illumination of a point passing through the illumination field, is illuminated with the same irradiance, this irradiance is the smallest unit by which the angular light distribution and the light energy can be adjusted.

In contrast, the present invention proposes to deliberately illuminate the reflective optical elements differently so that a point moving through the illumination field experiences successively different irradiances. This is possible because what only matters are the angular light distribution and the light energy after scan integration. Having significantly varying irradiances on the reflective optical elements makes it possible to more finely adjust the angular light distribution and the light energy on a point on the mask after scan integration.

This may be compared with a set of weights which is used for a pair of scales to weigh goods. Only if there are a variety of different weights, it is possible to combine the different weights such that the sum of the weights equals, at least to a good approximation, the weight of the good. If all weights were equal, only a very rough approximation could be achieved.

In one embodiment the group comprises at least eight reflective optical elements, wherein at least five different irradiances occur on the at least eight reflective optical elements. This ensures that there are enough different irradiances available from which the angular light distribution and the light energy can be assembled.

If the irradiance distribution on the array does not vary, step d) may comprise the steps of
d1) specifying maximum deviations by which the scan integrated real angular light distribution and the scan integrated real light energy for the point are allowed to differ from the scan integrated target angular light distribution and the scan integrated target light energy, respectively; and
d2) determining, for each reflective optical element of the group, a tilt angle in such a way that the maximum deviations are not exceeded.

Such an approach, which generally involves the solution of an optimization problem, ensures that the scan integrated real angular light distribution and the scan integrated real light energy approximates the target angular light distribution and the target light energy, respectively, that have been specified in step b).

If the irradiance distribution on the array varies, the illumination conditions at mask level may be influenced by shifts of the irradiance distribution on the array. Such shifts may occur as a result of beam direction fluctuations in the light source, which often cannot be completely suppressed. Since the light source and the illumination systems are often spaced apart by several meters, even minute variations of the beam direction translate into significant lateral shifts of the irradiance distribution on the array.

For illumination systems in which the array illuminates an optical integrator, EP 2 209 135 A1 proposes to detect the irradiance distribution produced by the light source on a mirror array and to perform a real time adjustment of the tilt angles of the mirror array in order to ensure stable illumination conditions at mask level. However, this approach requires very complex control schemes if one takes in mind that the array may comprise several thousand or even millions of mirrors. Real time control then becomes difficult.

For that reason it may be preferred that the tilt angles are not changed at all if the light distribution on the array changes during step f). This will generally require that the tilt angles are determined in a sophisticated manner so that the illumination conditions at mask level are not significantly affected by shifts of the light distribution on the array. Then step d) comprises the following steps:
d1) specifying maximum deviations by which the scan integrated real angular light distribution and the scan integrated real light energy for the point are allowed to differ from the scan integrated target angular light distribution and the scan integrated target light energy, respectively;
d2) specifying maximum shifts of the irradiance distribution on the array that may occur during operation of the apparatus;

d3) determining, for each reflective optical element of the group, a tilt angle in such a way that the maximum deviations are not exceeded if the maximum shifts of the irradiance distribution on the array occur.

The determination in step d3) may be achieved by using an optimization algorithm. During the optimization, the tilt angles of the reflective optical element of the group are varied until the maximum deviations are not exceeded. The optimization algorithm may be terminated immediately after the deviations are smaller than the maximum deviations that can be tolerated. Another option is to continue with the optimization process for a specified time period so that the optimization may yield even better results. The optimization is, unlike the prior art solutions, not intended for a real time control of the tilt angles, but for an initial setting of the tilt angles. This initial setting has to be changed only if the scan integrated target angular light distribution and/or the scan integrated target light energy shall be modified. Thus there is usually sufficient time to perform the optimization until the optimum set of tilt angles is obtained. Then the tilt angle may be determined in step d3), for each reflective optical element of the group, such that changes of the irradiance distribution on the array have a minimum effect on the scan integrated real angular light distribution and the scan integrated real light energy. In other words, the optimization process is continued until the optimization algorithm has been able to prove that it has found the global optimum.

The optimization algorithm may involve the solution of a mixed integer linear problem. Such problems can be solved using standard numerical algorithms. For improving the optimization, heuristic approaches, and in particular the Variable Neighborhood Decent (VND), may be used.

It has been found that if the irradiance distribution on the array varies at least substantially according to a Gauss or a super Gauss distribution along the first line, this facilitates the optimization that has to be carried out in order to find a set of tilt angles that tolerates also shifts of the irradiance distribution on the array.

Since the mask moves only along a single scan direction, it suffices, with a view to finely adjusting the angular light distribution and the light energy, to vary the irradiance on the array along one direction which corresponds to the scan direction and to which the first line is parallel. Consequently, the irradiance distribution on the array may be at least substantially constant along a direction that is perpendicular to the first line. This ensures that shifts of the irradiance distribution may have an impact only along the scan direction, but not along the cross-scan direction. Furthermore, if no field dependent angular light distribution is required, the optimization process may be performed only for the reflective optical elements of a single group, because the reflective optical elements in other groups illuminating different cross-scan positions can be controlled in the same manner.

In order to be able to finely adjust the angular light distribution at mask level after scan integration, there should be a continuous range of tilt angles available for each reflective optical element. On the other hand, at least one reflective element should have a tilt position in which it does not contribute to the illumination of the mask.

Subject of the invention is also an apparatus which is capable of performing the method described above. The apparatus in accordance with the present invention comprises:

a) a light source,
b) an illumination system comprising:
   an array of reflective optical elements, wherein each reflective optical element is configured to be tilted around at least one tilt axis by a tilt angle,
   a first optical system that is arranged in a light path between the light source and the array, wherein the first optical system is configured to collect the light emitted by the light source and to produce a light irradiance distribution on the array, wherein the light irradiance distribution varies by at least 50% along a first line,
   a second optical system that is arranged between the array and a mask to be illuminated, wherein
      the second optical system is configured to produce an illumination field on the mask, wherein the illumination field is a real image of the array of reflective optical elements, and wherein
      the first line is imaged on a second line on the mask that extends parallel to a scan direction of the apparatus,
   a control unit which is configured to perform the following steps:
      receiving a scan integrated target angular light distribution and a scan integrated target light energy for a point that moves through the illumination field along the second line;
      determining, for each reflective optical element through which the first line extends, tilt angles such that a scan integrated real angular light distribution and a scan integrated real light energy for the point approximate the scan integrated target angular light distribution and the scan integrated target light energy, respectively;
      setting the determined tilt angles;
c) a projection objective that is configured to image the mask on a surface.

DEFINITIONS

The term "light" denotes any electromagnetic radiation, in particular visible light, UV, DUV, VUV and EUV light.

The term "light ray" is used herein to denote light whose path of propagation can be described by a line.

The term "light bundle" is used herein to denote a plurality of light rays that emerge from and/or converge to a single point.

The term "light beam" is used herein to denote all light that passes through a particular lens or another optical element.

The term "surface" is used herein to denote any planar or curved surface in the three-dimensional space. The surface may be part of a body or may be completely separated therefrom, as it is usually the case with a field or a pupil plane.

The term "optically conjugate" is used herein to denote an imaging relationship between two points or two surfaces. Thus a light bundle emerging from a point converges at an optically conjugate point.

The term "field plane" is used herein to denote a plane that is optically conjugate to the mask plane.

The term "pupil plane" is used herein to denote a plane in which marginal rays passing through different points in the mask plane or another field plane intersect. As usual in the art, the term "pupil plane" is also used if it is in fact not a plane in the mathematical sense, but is slightly curved so that, in a strict sense, it should be referred to as pupil surface.

The term "uniform" is used herein to denote a property that does not depend on the position.

The term "irradiance distribution" or "spatial irradiance distribution" is used herein to denote how the total irradiance varies over a surface on which light impinges. Usually the spatial irradiance distribution can be described by a function $I_s(x, y)$, with x, y being spatial coordinates of a point on the surface.

The term "angular light distribution" is used herein to denote how the irradiance of a light bundle varies depending on the angles of the light rays that constitute the light bundle. Usually the angular irradiance distribution can be described by a function $I_a(\alpha, \beta)$, with $\alpha, \beta$ being angular coordinates describing the directions of the light rays. If the angular irradiance distribution has a field dependency, $I_a$ will be also a function of field coordinates x,y, i.e. $I_a=I_a(\alpha, \beta, x, y)$.

The term "scan direction" is used herein to denote a direction along which a mask moves during an exposure. Usually this direction is reversed once the rim of the wafer has been reached. Thus the scan direction is in fact a non-directional orientation in space.

BRIEF DESCRIPTION OF THE DRAWINGS

Various features and advantages of the present invention may be more readily understood with reference to the following detailed description taken in conjunction with the accompanying drawings in which.

DESCRIPTION OF PREFERRED EMBODIMENTS

I

General Construction of Projection Exposure Apparatus

Figure 1:
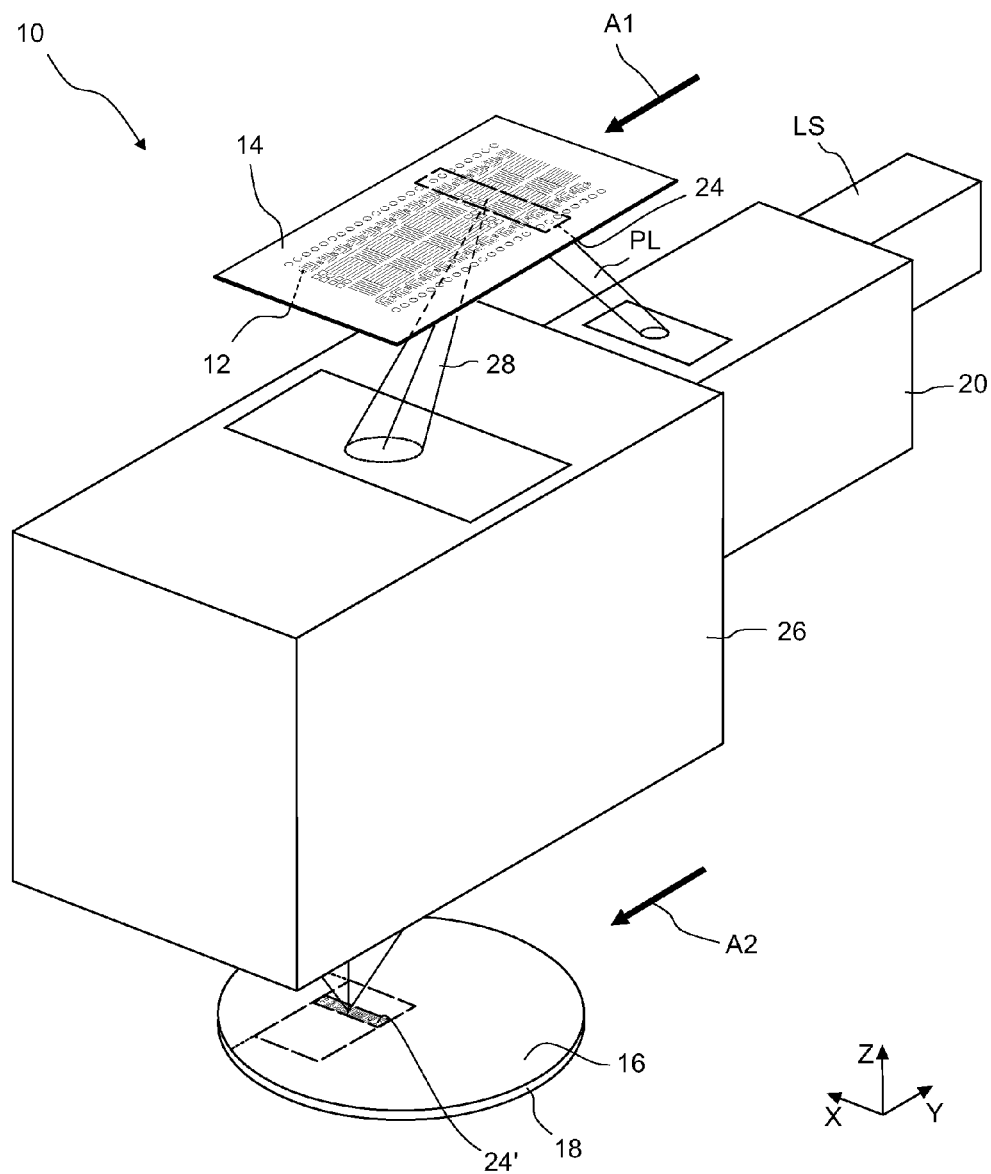
FIG. 1 is a schematic perspective view of a projection exposure apparatus in accordance with one embodiment of the present invention.

FIG. 1 is a perspective and highly schematic illustration showing a projection exposure apparatus 10 in accordance with the present invention. The apparatus 10 serves to image a pattern of reflecting structures 12, which are arranged on the underside of a mask 14, on a light-sensitive layer 16 which may be formed, for example, by a photoresist. The light-sensitive layer 16 is supported by a wafer 18 or another suitable substrate which is held by a wafer stage (not shown in FIG. 1).

The projection exposure apparatus 10 comprises a light source LS that is configured to produce projection light PL having a center wavelength between 5 nm and 30 nm. In the embodiment shown the center wavelength of the projection light PL is approximately 13.5 nm and therefore lies in the extreme ultraviolet spectral range (EUV). Other center wavelengths, in particular between 6.6 nm and 6.8 nm, are also possible.

In the embodiment shown, the light source is a free-electron laser (FEL). Such devices are known from WO 2009/121438 A1, for example. The projection exposure apparatus 10 further comprises an illumination system 20 which directs the projection light PL produced by the light source LS on the underside of the mask 14, where it illuminates a field that will be referred to in the following as illumination field 24. The latter has, in the embodiment shown, the geometry of an elongated rectangle. In other embodiments that will be described further below, the illumination field 24 has the shape of a ring segment.

The projection exposure apparatus 10 further comprises a projection objective 26 which images the structures 12, which are situated at a given time inside the illumination field 24, on the light-sensitive layer 16. The projection objective 26 has a magnification $\beta$ with $|\beta|<1$ so that a reduced image 24' of the structures 12 situated in the region of the illumination field 24 is formed on the light-sensitive layer 16.

The projection exposure apparatus 10 is designed for a scanning operation during which the mask 14 is displaced synchronously with the wafer 18 during the exposure of the light-sensitive layer 16. The displacement movements of the mask 14 and of the wafer 18 are indicated in FIG. 1 by arrows A1 and A2, respectively. The ratio of the speeds of the wafer 18 to the mask 14 is equal to the magnification $\beta$ of the projection lens 26. In the embodiment shown the image 24 is erect ($\beta>0$) so that the mask 14 and the wafer 18 move along the same direction during an exposure operation. Since the illumination field 24 passes over the mask 14 in a scanner-like fashion during the exposure operation, regions being significantly larger than the illumination field can be transferred to the light-sensitive layer 16.

In FIG. 1 a light bundle 28 is indicated that emerges from a point within the illumination field 24. The light bundle 28 enters the projection objective 26, which forces the light bundle 28 to converge on a single point in the image plane of the projection objective 26 in which the light-sensitive layer 16 is arranged. The relationship between field points in the object plane of the projection objective 26, in which the structures 12 are arranged, and the image plane, in which the light-sensitive surface 16 is arranged, is usually referred to as imaging relationship or optical conjugation.

The opening angle of the light bundle 28 entering the projection objective 26 is a measure of its object-side numerical aperture NA. As a result of the magnification $|\beta|<1$, the image-side numerical aperture NA of the projection objective 26 is increased by the reciprocal of the magnification $|\beta|$.

II

Illumination System

Figure 2:
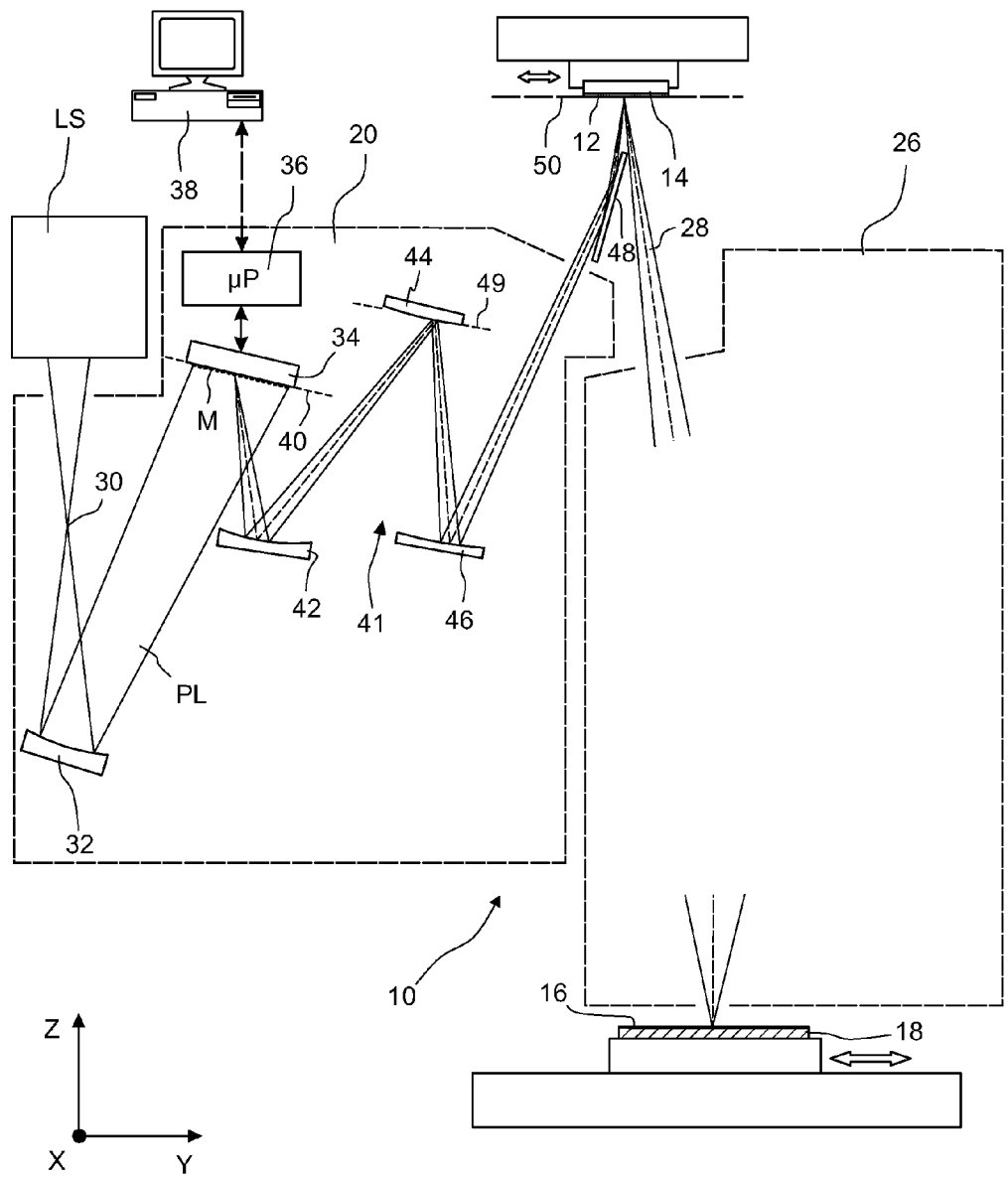
FIG. 2 is a meridional section through the apparatus shown in FIG. 1.

FIG. 2 is a schematic meridional section through the projection exposure apparatus 10. The light source LS typically comprises a collector (not shown) which focuses the projection light in an intermediate focus point 30. A first optical system 32, which is formed in this embodiment by a single free-form mirror, directs the projection light emerging from the focus point 30 towards an array 34 of micro-mirrors M in a manner that will be described further below in more detail. The array 34 is controlled by a control unit 36 that is connected to an overall system control 38 of the projection exposure apparatus 10.

The micro-mirrors M of the array 34 are arranged in an object plane 40 of a second optical system 41 comprising mirrors 42, 44, 46 and 48 and having a pupil plane 49 in the vicinity of the mirror 44. The last mirror 48 is designed for grazing incidents. The second optical system 41 images the micro-mirrors M arranged in the object plane 40 on an image plane 50 that coincides with the object plane of the projection objective 26. The illumination field 24 produced on the underside of the mask 14 is thus a real image of the array 34. For that reason the array 34 and the illumination field have the same geometry, but generally different sizes, as long as the second optical system 41 has the same magnification along the X and Y direction.

Figure 3:
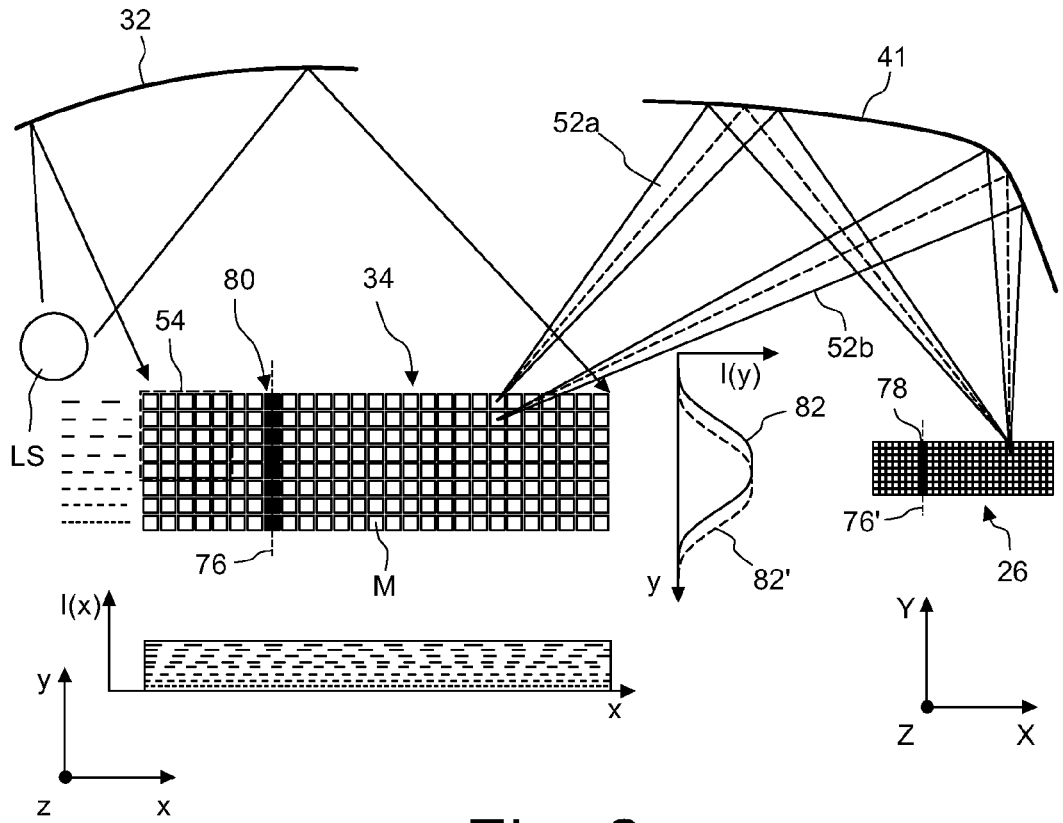
FIG. 3 illustrates in a highly schematic manner how an illumination field is formed on a mask as an image of an array of micro-mirrors.

FIG. 3 illustrates, in a highly schematic representation, the light source LS, the first optical system 32, the array 34 of micro-mirrors M (in a top view), the second optical system 41 and the illuminated field 26 formed by a real image of the array 34. The imaging relationship established by the second optical system 41 is illustrated in FIG. 3 by two light bundles 52a, 52b that emerge from points on two different micro-mirrors M under different directions and finally converge in two optically conjugate points in the illuminated field 26.

Figure 4:
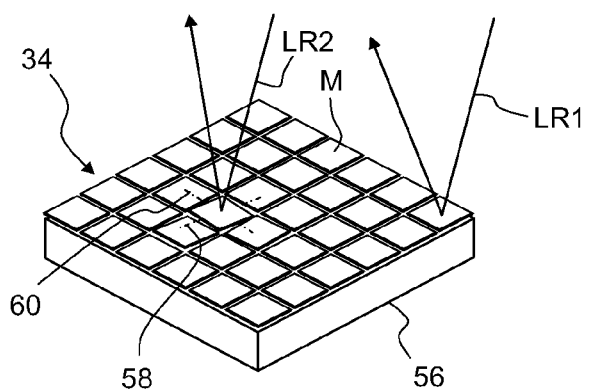
FIG. 4 is a perspective view of a portion of the array of micro-mirrors.

In the embodiment shown the array 34 comprises 8×27 micro-mirrors M that are arranged in a regular grid-like pattern. Each micro-mirror M can be tilted about two orthogonal tilt axes by tilt angles that can be controlled individually for each micro-mirror M. This is illustrated in FIG. 4 which shows an enlarged perspective view of a portion 54 of the array 34. The portion 54 comprises 6×6 micro-mirrors M which are arranged on a common substrate 56. The orthogonal tilt axes denoted by 58, 60 are indicated for one of the micro-mirrors M. Two light rays LR1 and LR2 impinging with the same angle of incidence illustrate how the angular distribution of light can be modified by tilting the micro-mirrors M individually.

Figure 5:
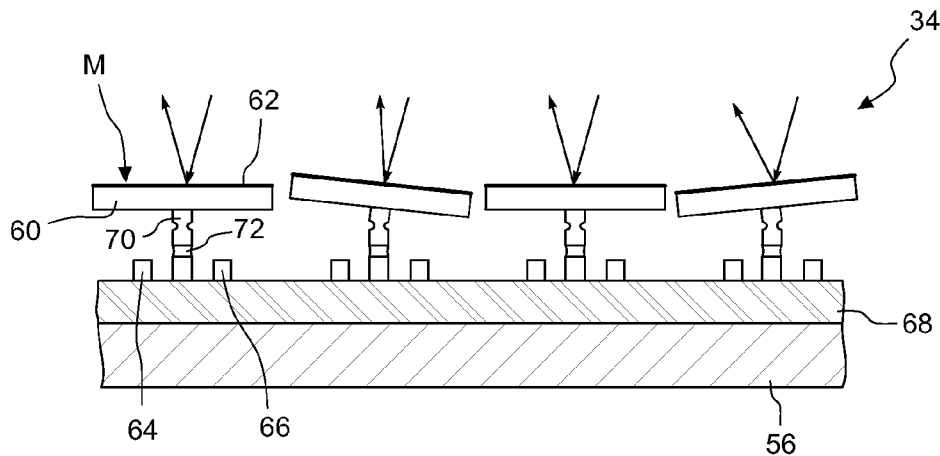
FIG. 5 is a schematic cross-section through a portion of the array of micro-mirrors.

FIG. 5 is a schematic cross section through four micro-mirrors M of the array 34. Each micro-mirror M comprises a mirror substrate 60 and a reflective coating 62 applied thereon. The coating 62 typically comprises a plurality of thin double layers having alternate refractive indices. The coatings are designed with a view to maximizing the reflectance for the projection light PL. Electrostatic actuators 64, 66 are arranged underneath the micro-mirrors M on a circuit board 68 so as to tilt the micro-mirrors M around the tilt axes that are defined by solid state joints 70, 72.

A light bundle from a micro-mirror M of the array 34 may not contribute to the illumination of the mask 14 for certain tilt angles of the micro-mirror. A certain amount if light can thus intentionally be lost in a controlled manner. This may be achieved by proper placement of an aperture in the illumination system 20 at some point between the array 34 and the image plane 50. Locating this aperture near a pupil plane 49 may be beneficial as such a placement usually will reduce the necessary tilt angles, among others relaxing requirements on the actuators 64, 66 and/or the solid state joints 70, 72.

III

Control of Micro-Mirror Array

Referring back to FIG. 3, it will now be explained how the desired illumination conditions at mask level may be achieved with the help of the illumination system 20.

Each point on the mask 14 has to be illuminated with a well-defined light energy and angular light distribution. Generally, the light energy received by each point of the mask 14 should be identical, and usually this also applies to the angular light distribution. However, since the mask 14 moves through the illumination field 26 during an exposure, these conditions do not have to be fulfilled also for the points in the illuminated field 26. Instead, it suffices that these conditions are fulfilled after the respective point on the mask has completely moved through the illumination field. Thus the irradiance in the illuminated field 26 may vary provided that the light energy, i.e. the scan integrated irradiance, is equal to a target light energy.

Similar considerations also apply to the angular light distribution. For example, if a point on the mask 14 shall be illuminated from two opposite directions only, which corresponds to a dipole illumination setting, it suffices that the respective point is illuminated exclusively from one side during the first half of its way through the illumination field 26, and illuminated exclusively from the opposite side during the second half of its way, for example. After scan integration, the point is evenly illuminated from both directions as desired.

In the following it will be assumed that a point on the mask 14 at a certain position along the cross-scan direction X, which is perpendicular to the scan direction Y of the projection exposure apparatus 10, passes through the illumination field 26. As a result of the scanning movement of the mask 14 along the scan direction Y, the point moves through the illumination field 26 along a line 76' which extends parallel to the scan direction Y. As it can be seen in FIG. 3, the line 76' extends through a stripe 78 which is a real image of a group 80 of micro-mirrors M. For illustrative purposes the micro-mirrors M of the group 80 and also its image (stripe 78) are shown in black color. The line 76' is an image of a line 76 that extends through the group 80 of micro-mirrors M, as it is shown in FIG. 3.

While the point on the mask 14 passes along the line 76 and through the stripe 78, it will thus be illuminated successively by the eight micro-mirrors M belonging to the group 80. Each micro-mirror M of the group 80 is illuminated by the light source LS with a different irradiance, and here it is further assumed that all eight micro-mirrors M of the group 80 are oriented with different tilt angles. Thus the point of the mask passing through the stripe 78 will be illuminated successively by eight light bundles having different irradiances and also different directions of incidence. For another group 80, the different directions of incidence are schematically illustrated in FIG. 3 by the light bundles 52a, 52b which impinge on the illumination field 26 from different directions.

Thus, by carefully determining the irradiance on each micro-mirror M and its tilt angles, it is possible to produce almost any arbitrary light energy and angular light distribution on each point on the mask 14 after scan integration. As a matter of course, the larger the number of micro-mirrors M within the group 80 is, the greater will be the flexibility to illuminate a point on the mask 14 with a desired target light energy and a desired target angular light distribution. How this determination is performed will be explained in more detail below in section V.

If all micro-mirrors M on the array 34 were illuminated with the same irradiance $I_0$, it would be difficult to achieve the target light energy and target angular light distribution on the mask 14. Then the light energy and angular light distribution could be adjusted only in equal steps given by the irradiance $I_0$ on each micro-mirror M. Therefore the irradiance distribution in each group 80 should vary by at least 50%, and preferably by at least 75%. A variation of 50% means that the minimum irradiance is 50% of the maximum irradiance. Such a variation of the irradiance makes it possible to finely adjust the light energy and angular light distribution at mask level.

On the other hand, points on the mask 14 should be illuminated with the same light energy irrespective of their cross-scan position X. Thus, for each group 80, the integral over the irradiances on all micro-mirrors M should be identical.

This can be achieved very simply by illuminating the array 34 in such a manner that the irradiance varies only along the y direction, but not along the x direction. In this context it has to be mentioned that the directions x, y referring to the array 34 correspond to the directions X and Y, respectively, at mask level. The directions x and X on the one hand and the directions y and Y on the other hand do not have to be parallel, because the second optical system 41 may rotate the coordinate systems in its object plane 40 and its image plane 50.

IV

Illumination of Micro-Mirror Array

Diagrams I(x) and I(y) in FIG. 3 illustrate a possible irradiance distribution on the array 34 which is produced by the light source and the first optical system 32. In the diagram I(x) the different broken lines correspond to different y coordinates, as they are indicated by additional broken lines shown on the left hand side of the array 34. Thus all micro-mirrors M in a row extending parallel to the x direction are illuminated with the same irradiance. However, different rows are illuminated with different irradiances. For example, rows in the center of the array 34 are illuminated more strongly than rows at the lateral edges of the array 34.

In the embodiment shown it is assumed that this dependency on the y coordinate, which corresponds to the scan direction Y at mask level, is approximated by a Gaussian function. Thus in each group 80 the micro-mirrors M are illuminated with a Gaussian irradiance distribution I(y), as it is denoted in FIG. 3 by 82 in a graph shown to the right of the array 34.

Strictly speaking, it is not the irradiance distribution on the array 34 which matters, but the irradiance which is reflected by each micro-mirror M. Thus, a simple way to achieve the irradiance distributions I(x) and I(y) shown in FIG. 3 is to individually detune the reflective coatings 62 on each micro-mirror M in such a manner that the reflected light has the desired intensity. However, since this involves relatively high light losses, it is preferred to design the first optical system 32 so that the desired irradiance distribution is obtained on the array 34.

In the following it will be described with reference to FIGS. 6 and 7 how a rotationally symmetrical Gaussian irradiance distribution of a light beam can be transformed into a rectangular irradiance distribution along a certain direction.

Figure 6:
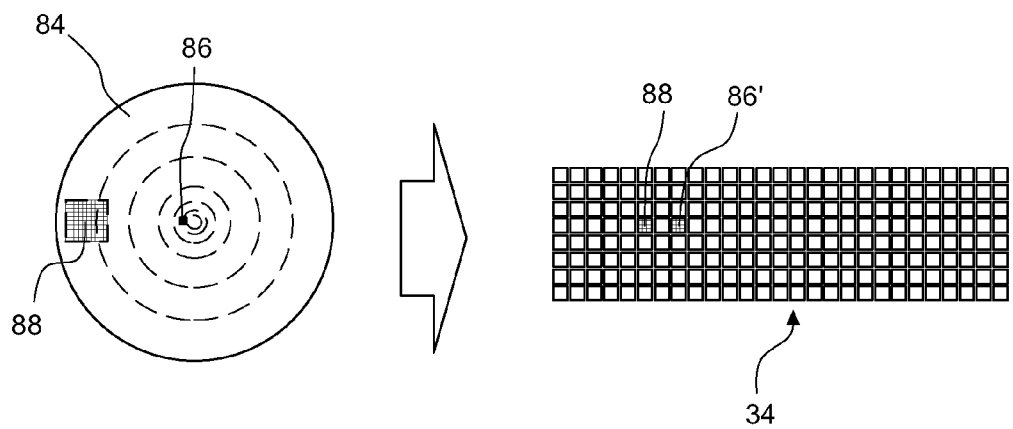
FIG. 6 illustrates how a rotationally symmetric Gaussian irradiance distribution is transformed in a rectangular irradiance distribution.

FIG. 6 illustrates on the left hand side a cross section through a projection light beam 84 emerging from the focus point 30. The dotted lines shall represent a rotationally symmetric Gaussian irradiance distribution. Thus the irradiance at the center of the light beam 84 is higher than at its circumference.

Since the light beam 84 diverges after the focus point 30, it is more appropriate to consider the angular light distribution as defined with respect to a main propagation axis of the light beam 84. Then in a Gaussian irradiance distributions the irradiance is for small angles is higher than the irradiance for larger angles. Thus regions corresponding to small angles in the angular space have to be expanded in the positional space, while regions with large angles have to be compressed in the positional space. This is illustrated in FIG. 6 by a region 86 near the axis of the light beam 84 where the irradiance is high. This angular region 86 is expanded in the position space to a region 86' that is shown on the array 34. In contrast, an angular region 88 in proximity to the circumference of the light beam 84 is compressed to form a region 88' in the position space having the same irradiance as the region 86'.

Figure 7:
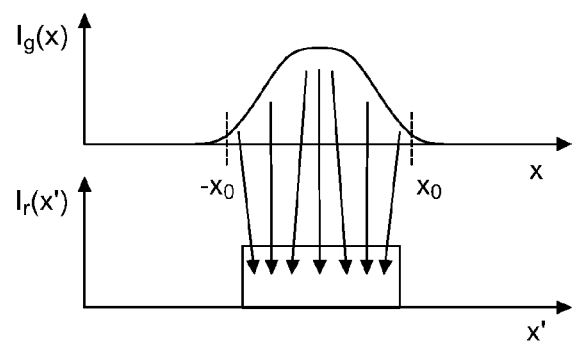
FIG. 7 illustrates the same point by using two diagrams.

FIG. 7 illustrates the same considerations in a different way. Arrows between the upper diagram representing a Gaussian irradiance distribution $I_g(x)$ and the lower diagram representing a rectangular irradiance distribution $I_r(x')$ indicate how light has to be shifted between different x positions by the first optical system 32. It can be shown that the following function x'(x) describes which x' position in the lower diagram has to be illuminated by a position x in the upper diagram:

$$x'(x) = \sqrt{2\sigma} \operatorname{erf}^{-1}\left[x \operatorname{erf}\left(\frac{x_0}{\sqrt{2}\sigma}\right)\right] \tag{1}$$

The term $x_0$ describes the portion of the irradiance distribution $I_g(x)$ which can be used, taking in mind that a Gaussian irradiance distribution extends to infinity (see upper diagram in FIG. 7). The term σ denotes, as usual, the standard deviation of the Gaussian irradiance distribution.

On the basis of equation (1) a suitable design for the first optical system 32 can be easily deduced using standard algorithms.

Generally, the design of the first optical system 32 can be simpler if the light source LS has a high brilliance, i.e. the emitted light beam has, in a given plane, both a small diameter and a small divergence. Light sources configured for a spectral range between 5 nm and 30 nm and having this property are, for example, electron-based light sources such as synchrotrons or free-electron lasers (FEL). The high brilliance makes it even possible to design the first optical system 32 with a single reflective surface, only, because there is no need to establish an imaging relation. Using as few reflective surfaces as possible is generally beneficial in EUV apparatus with a view to reducing light losses which are inevitably caused by each reflective surface.

V

Determination of Tilt Angles

In the following it will be explained how the tilt angels for the micro-mirrors M can be computed such that each point on the mask is illuminated after scan integration with the target light energy and the target angular light distribution.

First the irradiance distribution on the array 34 has to be determined. Preferably the irradiance distribution on the array 34 is first carefully designed to simplify the optimization that will be explained below. Deviations of the real irradiance distribution from the design values are then measured and taken into account in the algorithms.

The following explanations relate to a single group 80 only. If the irradiance distribution on the array 34 does not vary along the x direction, it suffices to perform the following algorithm only once. If there is a variation also along the x direction, the algorithm has to be performed for more than one group 80.

The same applies if the angular light distribution and/or the light energy on a mask point shall vary along the cross-scan direction X. Also in that case the algorithm has to be performed separately for each group 80.

Figures 8, 9, 10:
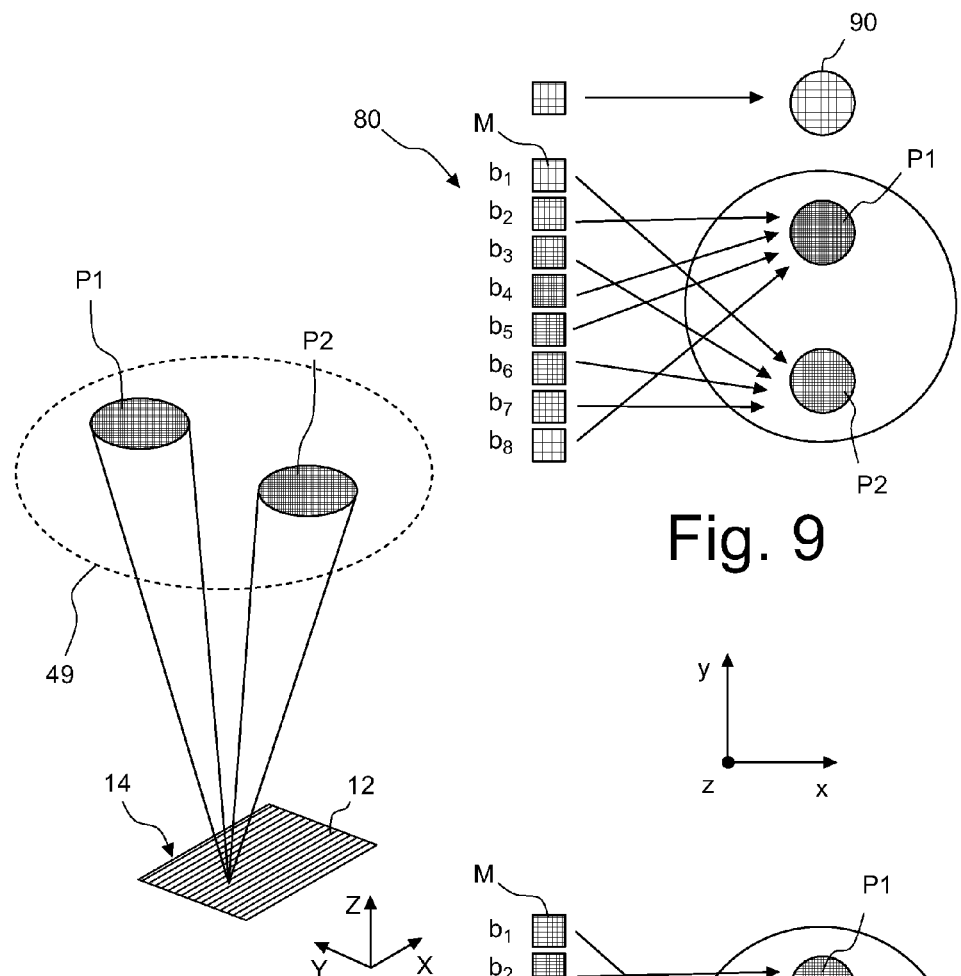
FIG. 8 is a schematic perspective view of a pupil plane in the illumination system in the case of a dipole illumination setting.
FIG. 9 illustrates how a group of mirrors illuminates the pupil plane.
FIG. 10 corresponds to FIG. 9, but with a shifted irradiance distribution on the group of mirrors.

Furthermore, it is assumed that a desired target angular light distribution at mask level can be transformed into an irradiance distribution in the pupil plane 49 of the illumination system 20, wherein the irradiance distribution is a combination of M poles $P_1$ to $P_M$. In FIG. 8 an exemplary irradiance distribution in the pupil plane 49 is shown for a Y dipole illumination setting (M=2).

The target irradiance of the pole $P_k$ shall be $a_k$. The target total irradiance of a point illuminated on the mask 14 by a group 80 is then given by $$\sum_{k=1}^{M} a_k.$$

This target total irradiance is directly proportional to the target light energy received by this point after it has moved through the illumination field 26. This target total irradiance may be smaller than the sum of the irradiances of the micro-mirrors in the group 80, allowing to finely adjust the irradiance on the mask.

However, the real irradiance at each pole $P_k$, which is denoted in the following by $\tilde{a}_k$, generally deviates from the target irradiance $a_k$. If a maximum deviation $\Delta$ of the total irradiance from the target total irradiance is permitted, this may be described as $$\left| \sum_{k=1}^{M} a_k - \sum_{k=1}^{M} \tilde{a}_k \right| \leq \Delta \tag{2}$$

Similarly, a maximum permitted deviation of the irradiances of each pole $P_k$ may be defined by $$|a_k - \tilde{a}_k| \leq f\Delta \, \forall k=1, \ldots, M. \tag{3}$$

The parameter $f \geq 1$ describes that deviations of the irradiances in the individual poles in the pupil plane 49 are usually less critical than deviations from the total irradiance.

The tilt angle of each micro-mirror M may be described by variables $c_{ij}$. Here $c_{ij}$ shall be 1 if the ith micro-mirror M is tilted such that the projection light reflected therefrom contributes to the illumination of the pole $P_j$ in the pupil plane 49. Otherwise $c_{ij}$ equals 0.

Since each micro-mirror M can illuminate, at a given time, only a single pole $P_j$, this results in the condition $$0 \leq \sum_{j=1}^{M} c_{ij} \leq 1 \tag{4}$$

$$\forall i = 1, \ldots, N$$

with N being the total number of micro-mirrors M in each group 80. The sign of inequality follows from the fact that the ith micro-mirror M may also be brought into a position in which the micro-mirror does not contribute to the illumination of the mask 14 at all.

The real irradiance on the jth micro-mirror M within the group 80 is denoted by $b_j$, as it is indicated in FIG. 9. The real irradiance $\tilde{a}_k$ in pole $P_k$, which is obtained with a given combination of tilt angles $b_i$, is thus given by $$\tilde{a}_k = \sum_{i=1}^{N} c_{ik} b_i \tag{5}$$

In order to find a combination of tilt angles $c_{ij}$ which ensures the above conditions (2) and (3) with the necessary boundary conditions, this results in the following optimization problem:

$$\left.\begin{array}{ll} \min \Delta \text{ via } \{c_{ij}\} \\[6pt] \sum_{k=1}^{M}\sum_{i=1}^{N} c_{ik}b_i - \sum_{k=1}^{M} a_k \leq \Delta \\[6pt] \sum_{k=1}^{M}\sum_{i=1}^{N} c_{ik}b_i - \sum_{k=1}^{M} a_k \geq -\Delta \\[6pt] \sum_{i=1}^{N} c_{ik}b_i - a_k \leq f\Delta & k=1,\ldots,M \\[6pt] \sum_{i=1}^{N} c_{ik}b_i - a_k \geq -f\Delta & k=1,\ldots,M \\[6pt] 0 \leq \sum_{k=1}^{M} c_{ik} \leq 1 & \forall i=1,\ldots,M \\[6pt] c_{ik} \in \{0,1\} & \forall i=1,\ldots,N, \\ & k=1,\ldots,M \end{array}\right\} = P \tag{6}$$

This reduces to a mixed integer linear problem which can be solved with established numerical algorithms. These algorithms generate a sequence of currently best solutions of increasing quality until a solution of sufficient quality has been found. In addition, they can also compute a bound on the difference between the quality of the current best solution and the global optimum. This allows to defer information on how much the solution quality can at most increase if the algorithm is allowed to continue its operation for some more time. In particular, the algorithm can also prove that its currently best solution is a global optimum such that no further improvement is possible.

VI

Shifts of Irradiance Distribution on Micro-Mirror Array

In the above section V it has been assumed that the real irradiance $b_i$ on the ith micro-mirror of the group 80 does not vary. However, at least with certain types of light sources LS variations of the irradiance distribution on the array 34 may occur. Particularly if the light source LS is arranged quite a distance away from the array 34, minute fluctuations of the direction of the light beam emitted by the light source LS result in significant shifts of the irradiance distribution on the array 34.

Assuming that the irradiance distribution does not vary along the x direction, as this has been explained above with reference to FIG. 3, a shift of the irradiance distribution along the x direction will not have any impact on the illumination of the mask 14, as long as the irradiance distribution produced on the array 34 extends along the x direction to some extent over the array 34.

However, in the y direction, which corresponds to the scan direction Y of the projection exposure apparatus 10, the irradiance on the array 34 varies in order to be able to finely adjust the desired angular light distribution and light energy on the mask after scan integration. A shift of the irradiance distribution along the y direction is indicated in the I(y) diagram shown in FIG. 3 by a dotted line 82'.

Such a shift of the irradiance distribution has the effect that the micro-mirrors M in each group 80 will be illuminated with different irradiances. This generally results in a modified light energy and angular light distribution on the mask after scan integration.

The inventor has found out that it is possible to reduce these modifications to tolerable limits by suitably determining the tilt angles of the micro-mirrors M. In fact it has been proven that only with the approach explained above in section V it is possible to find a set of tilt angles $\{c_{ij}\}$ which ensures that deviations of the angular light distribution and the light energy at mask level, which are caused by a shift of the irradiance distribution on the array 34 along the y direction, are be kept within tolerable limits. This holds true even for moderate numbers N of the micro-mirrors M in each group 80. This is important, because it is generally not a feasible approach to provide an array 34 comprising billions of micromirrors M.

If the irradiance distribution on the array 34 may shift, equation (5) has to be replaced by $$\tilde{a}_{kl} = \sum_{i=1}^{N} c_{ik} b_{il}, \quad (7)$$

$$l = 1, \ldots, L.$$

wherein the index l denotes different irradiances on the ith micro-mirror M that differ by different lateral shifts. The coefficient $b_{il}$ indicates the real irradiance on the ith micro-mirror M for the shifted irradiance distribution l. The optimization problem of equation (6) then becomes equation (8) which is again a mixed integer linear problem. For improving the optimization, heuristic methods such as RINS or rounding, and in particular VND (Variable Neighborhood Decent) are very appropriate and help to solve the problem very efficiently.

$$\left.\begin{array}{ll} \min \Delta \text{ via } \{c_{ij}\} & \\ \sum_{k=1}^{M} \sum_{i=1}^{N} c_{ik} b_{il} - \sum_{k=1}^{M} a_k \leq \Delta & \forall l = 1, \ldots, L \\ \sum_{k=1}^{M} \sum_{i=1}^{N} c_{ik} b_{il} - \sum_{k=1}^{M} a_k \geq -\Delta & \forall l = 1, \ldots, L, \\ \sum_{i=1}^{N} c_{ik} b_{il} - a_k \leq f\Delta & \forall l = 1, \ldots, L, \\ & k = 1, \ldots, M \\ \sum_{i=1}^{N} c_{ik} b_{il} - a_k \geq -f\Delta & \forall l = 1, \ldots, L, \\ & k = 1, \ldots, M \\ 0 \leq \sum_{k=1}^{M} c_{ik} \leq 1 & \forall i = 1, \ldots, M \\ c_{ik} \in \{0, 1\} & \forall i = 1, \ldots, N, \\ & k = 1, \ldots, M \end{array}\right\} = P \quad (8)$$

If the coefficients $b_{il}$ representing the real irradiances on the micro-mirrors M for different shifts of the irradiance distribution are not measured, they may be computed in the following manner:

It is assumed that the irradiance distribution I(j) on the array 34 along the y direction is given by a super Gauss function $$I(y) \propto \exp(-\ln(10)y^p) \quad (9)$$

with p being the super Gauss parameter. The factor ln(10) expresses that the irradiance has decreased at edges of the array 34 extending along the x direction by ⅒. Furthermore, it is assumed that the array 34 extends along the y direction from y=−1 to y=+1.

For the optimization it is further assumed that d is the maximum shift which may occur, both with a positive and with a negative sign, and this distance is uniformly divided into L smaller shifts l=1, . . . , L separated from each other by 2d/(L−1). It has been found that L=25 offers a good comprise between computing time and the achievable accuracy of the result for arbitrary shifts of up to d in addition to those shifts l explicitly considered. The shifted irradiance distribution $I_l(y)$ for the shift l is then proportional to $$I_l(y) \propto \exp\left[-\ln(10)\left(y + 2d\frac{l-1}{L-1} - d\right)^p\right], \quad (10)$$

$$l = 1, \ldots, L.$$

Then the intensity $b_{il}$ on the ith micro-mirror M for the shift l is given by $$b_{il} = \frac{I_l\left(2\frac{i-1}{N-1} - 1\right)}{\sum_{i=1}^{N} I_l\left(2\frac{i-1}{N-1} - 1\right)}. \quad (11)$$

Equation (11) may be used to determine the tilt angles $c_{ij}$ for the optimization problem of equation (8).

In the following the invariance of the angular light distribution and light energy against shifts of the irradiance distribution along the y direction will be explained qualitatively with reference to FIGS. 8 to 10.

The exemplary irradiance distribution in the pupil plane 49 of the illumination system 20 shown in FIG. 8 consists of two poles P1, P2 having equal irradiances and being spaced apart along the Y direction. Such an Y dipole setting is particularly suited for imaging structures 12 which are arranged along the X direction on the mask 14, as this is illustrated in FIG. 8.

As it has been explained further above, each group 80 of the array 34 completely illuminates the poles P1, P2 in the pupil plane 49. On the left hand side of FIG. 9, which illustrates how this may be accomplished, one of the groups 80 consisting of eight micro-mirrors M is shown. The Gaussian irradiance distribution I(y) along the y direction on the array 34 has the effect that each micro-mirror M of the group 80 is illuminated with a different irradiance. More particularly, the micro-mirrors in the middle of the group 80 are stronger illuminated as the micro-mirrors M at the ends of the group 80. In FIG. 9 a higher irradiance is represented by a darker filling of the micro-mirrors M.

Each micro-mirror M can be tilted such that it directs the projection light at any arbitrary position in the pupil plane 49. For the sake of simplicity, it is further assumed that the light spot associated with each micro-mirror M has the same geometry and size as the poles P1, P2. At the top of FIG. 9 one of the micro-mirrors M and the spot 90 associated with it are shown.

By superimposing a plurality of the spots 90 one above the other it is thus possible to produce poles P1, P2 having an irradiance which depends on the selection of the micro-mirrors M that direct the reflected light towards the respective pole P1 or P2.

In FIG. 9 it can be seen that pole P1 is slightly brighter (represented by a darker filling) than pole P2, since it is generally not possible to achieve with a small number of micro-mirrors M perfectly equal irradiances in both poles P1, P2 by superimposing the spots 90. However, the difference between the irradiances in the poles P1, P2 is so small that it can be tolerated.

FIG. 10 illustrates the case after the irradiance distribution on the array 34 has shifted along the +y direction. Thus the micro-mirror in the middle of the group 80 is not illuminated any more with the highest irradiance. The crucial point is that the allocation of the micro-mirrors M to the poles P1, P2 has been selected such that the changed irradiances on the micro-mirrors M do not substantially affect the irradiance distribution in the pupil plane 49. In other words, the poles P1, P2 are irradiated in FIG. 10 substantially in the same way as before, i.e. with the original irradiance distribution shown in FIG. 9. The irradiances in the poles P1, P2 will generally alter slightly when the irradiance distribution on the array 34 shifts, but these changes can be tolerated.

If the irradiance of the poles P1, P2 is substantially invariant against shifts of the irradiance distribution on the array 34, this necessarily applies also to the scan integrated light energy at mask level. This is because the light energy is proportional to the irradiance integrated over the entire pupil plane 49. However, as expressed by equations (2) and (3), the allowed tolerances may be more restricted in this respect.

If it is known and/or expected that a certain light source LS together with a certain first optics 32 has other and/or additional fluctuations apart from a shift of the illumination of the array 34, the optimization procedure explained above can still be applied. The L different irradiance distributions $I_l(y)$ in Eq. (10) then simply have to be replaced by distributions that represent the other and/or additional fluctuations.

VII

Alternative Embodiments a) Curved Illumination Field

In the embodiments shown in FIGS. 2 to 10 it has been assumed that the micro-mirrors M of the array 34 are arranged in a regular rectangular grid. As a result of the imaging relationship established by the second optical system 41, this leads to a rectangular shape of the illumination field 26.

Figure 11:
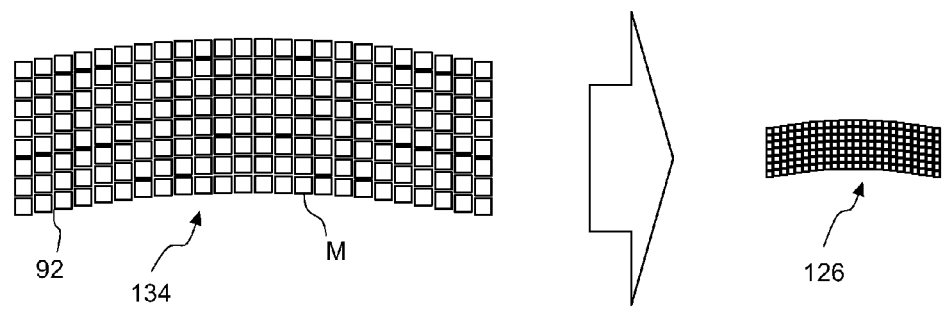
FIG. 11 is a schematic top view on an array of micro-mirrors according to a second embodiment in which the illuminated field has the shape of a ring segment.

With certain projection objectives 26 it is preferred that the illumination field has the shape of a ring segment. FIG. 11 illustrates a configuration of an array 134 of micro-mirrors M that results in such a curved illumination field 126'. Here the groups 180 are again formed by eight micro-mirrors M arranged one behind the other along the y direction. Since the groups 180 are slightly shifted along the Y direction, the array 134, and thus the illumination field 126, has approximately the shape of a ring segment.

b) Gap Orientation

Usually it will be inevitable that small gaps are left between adjacent micro-mirrors M if these shall be capable of tilting around one or two tilt axes. If the gaps extend parallel to the y direction, as this is the case in the arrays 34 and 134 described above, these gaps are imaged on the mask 14, and thus also the illumination field 126 will contain narrow stripes that are not illuminated by the projection light. This is usually not tolerable.

One approach is to arrange the arrays 34, 134 slightly outside the object plane 40 of the second optical system 41, or the mask slightly outside the image plane 50. Then the gaps denoted by 92 are not imaged sharply on the mask 14. Further information regarding this approach can be gleaned from US 2010/0157269 A1, which has been mentioned further above.

Figure 12:
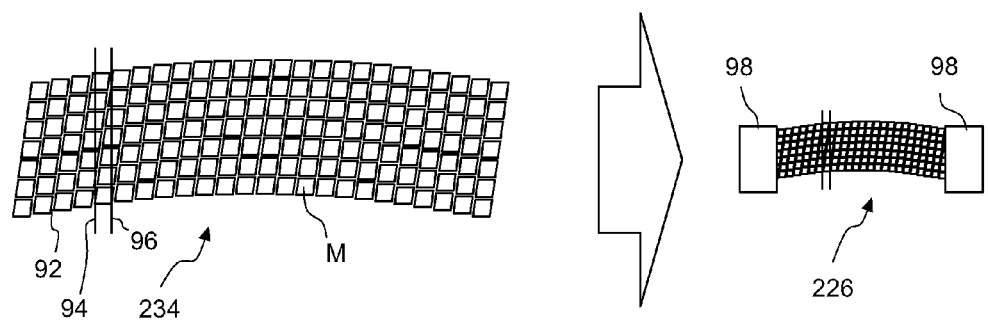
FIG. 12 is a schematic top view on an array of micro-mirrors according to a third embodiment in which the micro-mirrors are arranged in a skewed manner.

Another approach is shown in FIG. 12. Here the micro-mirrors M are arranged in a skewed pattern so that also the gaps 92 run obliquely with respect to the y direction. As a result of the scan integration, each arbitrary point on the mask will, during its scan movement, not be illuminated only once while it passes through the gap 92. This can be verified by following the two lines 94, 96 that are indicated in FIG. 12 on the left hand side. This holds true irrespective of the X position of the point in the illumination field 226. Therefore each point on the mask 14 receives the same light energy.

In this embodiment it can also be seen that the oblique rows of micro-mirrors M extending parallel to the y direction do not necessarily correspond any more to the groups 80. More specifically, a point on the mask will generally move through the images of micro-mirrors that belong to different rows. Equation (6) or (8) then has to be solved for several groups simultaneously.

In order to ensure that the short lateral edges of the illumination field 226 run parallel to the Y direction, a field stop may be arranged immediately underneath the mask 14 or immediately above the array 234.

VIII

Important Method Steps

Figure 13:
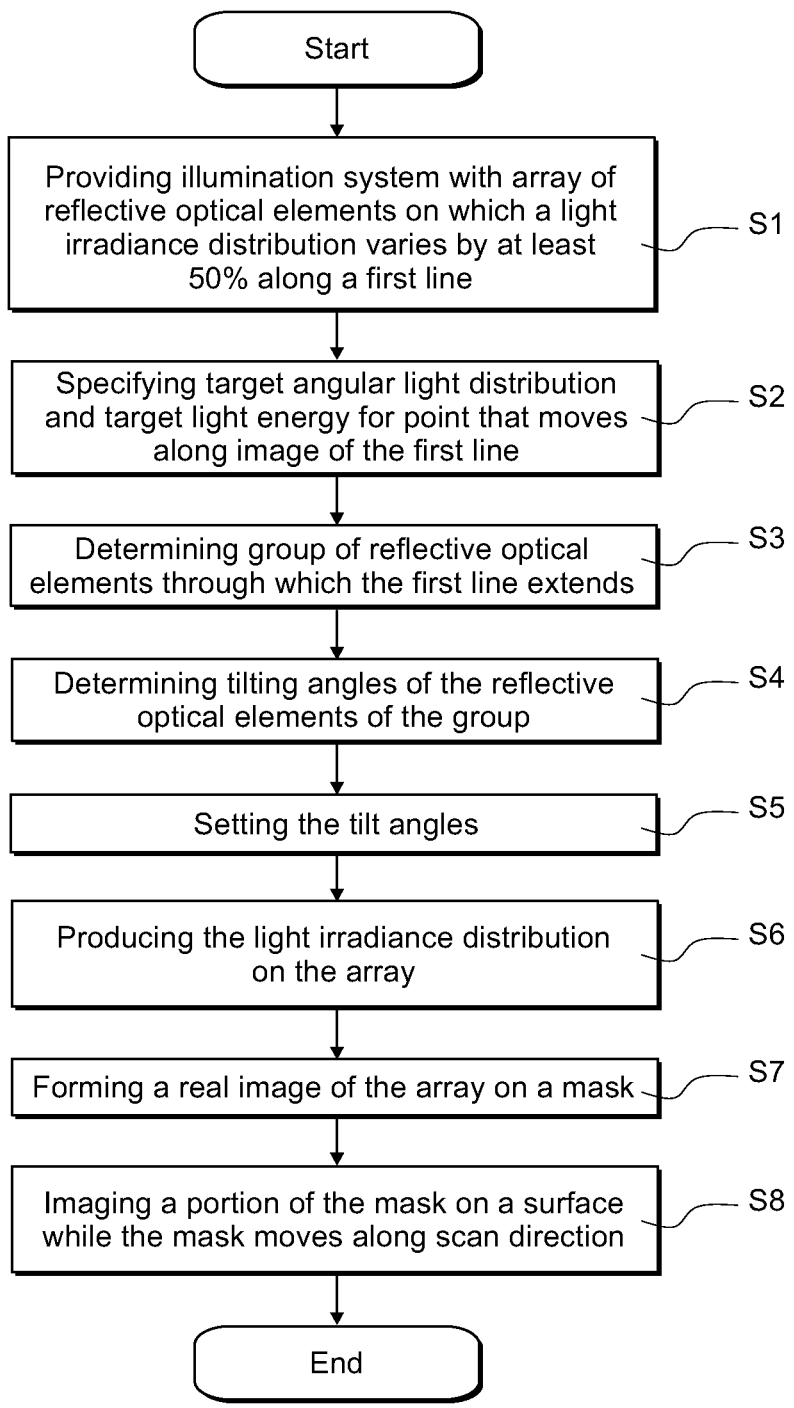
FIG. 13 is a flow diagram that illustrates important method steps in accordance with the present invention.

FIG. 13 is a flow diagram which illustrates important steps of operating a microlithographic apparatus in accordance with the present invention.

In a step S1 an illumination system with an array 34 of reflective optical elements M is provided on which a light irradiance distribution varies by at least 50% along a first line 76.

In a step S2 a target angular light distribution and target light energy for a point that moves along an image 76' of the first line 76 is specified.

In a step S43 a group 80 of reflective optical elements M, through which the first line 76 extends, is determined.

In a step S4 tilting angles $c_{ij}$ of the reflective optical elements M of the group 80 are determined.

In a step S5 the tilt angles $c_{ij}$ are set by the control unit 36.

In a step S76 the light irradiance distribution is produced on the array 34 using the light source LS and the first optical system 32.

In a step S7 a real image of the array 34 is produced on the mask 14.

In a step S8 a portion of the mask 14 is imaged on a surface, e.g. the light sensitive surface 16, while the mask 14 moves along the scan direction Y.

The invention claimed is:

1. A method of operating a microlithographic apparatus comprising an illumination system which comprises an array of reflective optical elements, each reflective optical element being tiltable by a title angle around a tilt axis, the illumination system configured to produce a light irradiance distribution on the array for reflective optical elements that are illuminated, the light irradiance distribution for the illuminated reflective optical elements varying by at least 50% along a first line, the method comprising:
   a) specifying: i) a scan integrated target angular light distribution for a point that moves through an illumination field of the illumination system along a second line extending parallel to a scan direction of the microlithographic apparatus; and ii) a scan integrated target light energy for the point, the second line being an image of the first line;
   b) determining a group of the reflective optical elements through which the first line extends;
   c) determining tilt angles of the reflective optical elements of the group so that a scan integrated real angular light distribution for the point and a scan integrated real light energy for the point approximate the target angular light distribution for the point and the target light energy for the point, respectively;
   d) setting the tilt angles determined in c); and
   e) producing the light irradiance distribution on the array for the illuminated reflective optical elements.

2. The method of claim 1, further comprising:
   f) producing the illumination field by forming a real image of the array on a mask; and
   g) imaging a portion of the mask illuminated by the illumination field on a surface while the mask moves along the scan direction.

3. The method of claim 1, wherein c) comprises:
   c1) specifying maximum deviations by which the scan integrated real angular light distribution and the scan integrated real light energy for the point are allowed to differ from the scan integrated target angular light distribution and the scan integrated target light energy, respectively; and
   c2) determining, for each reflective optical element of the group, a tilt angle so that the maximum deviations are not exceeded.

4. The method of claim 3, comprising performing c2) via an optimization algorithm involving the solution of a mixed integer linear problem.

5. The method of claim 1, wherein the tilt angles are not changed if the light distribution on the array changes during e).

6. The method of claim 5, wherein c) comprises:
   c1) specifying maximum deviations by which the scan integrated real angular light distribution and the scan integrated real light energy for the point are allowed to differ from the scan integrated target angular light distribution and the scan integrated target light energy, respectively;
   c2) specifying maximum shifts of the irradiance distribution on the array that may occur during e); and
   c3) determining, for each reflective optical element of the group, a tilt angle so that the maximum deviations are not exceeded if the maximum shifts of the irradiance distribution on the array occur.

7. The method of claim 6, wherein c3) comprises determining the tilt angle for each reflective optical element in the group so that changes of the irradiance distribution on the array have a minimum effect on the scan integrated real angular light distribution and the scan integrated real light energy.

8. The method of claim 7, wherein c3) comprises using an optimization algorithm involving the solution of a mixed integer linear problem.

9. The method of claim 8, comprising using a Variable Neighborhood Descent as a heuristic approach to solve the mixed integer linear problem.

10. The method of claim 6, wherein c3) comprises using an optimization algorithm involving the solution of a mixed integer linear problem.

11. The method of claim 10, comprising using a Variable Neighborhood Descent as a heuristic approach to solve the mixed integer linear problem.

12. The method of claim 1, wherein the irradiance distribution on the array is at least substantially constant along a direction perpendicular to the first line.

13. The method of claim 1, wherein the irradiance distribution on the array varies along the first line at least substantially according to a Gauss distribution or a super-Gauss distribution.

14. The method of claim 1, wherein each reflective optical element has a continuous range of tilt angles.

15. The method of claim 1, wherein the group comprises at least eight reflective optical elements, and at least five different irradiances occur on the at least eight reflective optical elements.

16. A method of operating an illumination system comprising an array of reflective optical elements, each reflective optical element being tiltable by a title angle around a tilt axis, the illumination system configured to produce a light irradiance distribution on the array for reflective optical elements that are illuminated, the light irradiance distribution varying by at least 50% along a first line for the illuminated reflective optical elements, the method comprising:
   setting tilt angles of reflective optical elements of a group of the reflective optical elements through which the first line extends so that a scan integrated real angular light distribution of a point that moves through an illumination field of the illumination system along a second line and a scan integrated real light energy for the point approximate a target angular light distribution for the point and a target light energy for the point, respectively, the second line being an image of the first line.

17. The method of claim 16, further comprising using the illumination system to produce the illumination field.

18. An apparatus, comprising:
an illumination system, comprising:
  a light source;
  an array of reflective optical elements, each reflective optical element being tiltable by a tilt angle around a tilt axis;
  a first optical system in a light path between the light source and the array, the first optical system configured to collect the light emitted by the light source and to produce a light irradiance distribution on the array for reflective optical elements that are illuminated which varies by at least 50% along a first line; and
  a second optical system along the light path between the array and a mask to be illuminated, the second optical system configured to produce an illumination field on the mask, the illumination field being a real image of the array of reflective optical elements;
a control unit; and
a projection objective configured to image an illuminated portion of the mask onto a surface,
wherein:
  during use of the apparatus, the first line is imaged on a second line on the mask, the second line extending parallel to a scan direction of the apparatus; and
  the control unit is configured so that, during use of the apparatus, the control unit:
    receives: i) a scan integrated target angular light distribution for a point that moves through the illumination field along the second line; and ii) a scan integrated target light energy for the point;
    determines, for each reflective optical element through which the first line extends, tilt angles so that a scan integrated real angular light distribution for the point and a scan integrated real light energy for the point approximate the scan integrated target angular light distribution for the point and the scan integrated target light energy for the point, respectively; and
    sets the determined tilt angles.

19. The apparatus of claim 18, wherein the irradiance distribution on the array is at least substantially constant along a direction perpendicular to the first line.

20. The apparatus of claim 18, wherein the irradiance distribution on the array varies along the line at least substantially according to a Gauss distribution or a super-Gauss distribution.

21. The apparatus of claim 18, wherein the first line extends through at least eight reflective optical elements, and during use of the apparatus at least five different irradiances occur on the at least eight reflective optical elements.

22. An apparatus, comprising:
an illumination system, comprising:
  a light source;
  an array of reflective optical elements, each reflective optical element being tiltable by a tilt angle around a tilt axis;
  a first optical system in a light path between the light source and the array, the first optical system configured to collect the light emitted by the light source and to produce a light irradiance distribution on the array for reflective optical elements that are illuminated which varies by at least 50% along a first line; and
  a second optical system along the light path between the array and a mask to be illuminated, the second optical system configured to produce an illumination field on the mask, the illumination field being a real image of the array of reflective optical elements; and
a control unit,
wherein:
  during use of the apparatus, the first line is imaged on a second line on the mask, the second line extending parallel to a scan direction of the apparatus; and
  the control unit is configured so that, during use of the apparatus, the control unit:
    receives: i) a scan integrated target angular light distribution for a point that moves through the illumination field along the second line; and ii) a scan integrated target light energy for the point;
    determines, for each reflective optical element through which the first line extends, tilt angles so that a scan integrated real angular light distribution for the point and a scan integrated real light energy for the point approximate the scan integrated target angular light distribution for the point and the scan integrated target light energy for the point, respectively; and
    sets the determined tilt angles.

* * * * *

UNITED STATES PATENT AND TRADEMARK OFFICE
CERTIFICATE OF CORRECTION

PATENT NO. : 9,612,540 B2  
APPLICATION NO. : 14/628544  
DATED : April 4, 2017  
INVENTOR(S) : Michael Patra Page 1 of 1

It is certified that error appears in the above-identified patent and that said Letters Patent is hereby corrected as shown below:

In the Specification

Column 13, Line 57, delete "$|a_k - \tilde{a}_k| \leq f\Delta \forall k = 1, \ldots, M$." and insert -- $|a_k - \tilde{a}_k| \leq f\Delta \quad \forall k = 1, \ldots, M$. --.

Column 16, Line 38, delete "1=I," and insert -- *I=1* --.

In the Claims

Column 19, Line 25, in Claim 1, delete "title" and insert -- tilt --.

Column 20, Line 50, in Claim 16, delete "title" and insert -- tilt --.

Signed and Sealed this  
Twenty-third Day of April, 2019

Andrei Iancu  
*Director of the United States Patent and Trademark Office*